US005571337A

United States Patent [19]
Mohindra et al.

[11] Patent Number: 5,571,337
[45] Date of Patent: Nov. 5, 1996

[54] METHOD FOR CLEANING AND DRYING A SEMICONDUCTOR WAFER

[75] Inventors: Raj Mohindra, Los Altos Hills; Abhay Bhushan, Palo Alto; Rajiv Bhushan, Mountain View; Suraj Puri, Los Altos; John H. Anderson, Milpitas; Jeffrey Nowell, San Francisco, all of Calif.

[73] Assignee: YieldUP International, Mountain View, Calif.

[21] Appl. No.: 437,541

[22] Filed: May 9, 1995

Related U.S. Application Data

[63] Continuation-in-part of Ser. No. 339,326, Nov. 14, 1994.
[51] Int. Cl.$^6$ .................................................. B08B 3/04
[52] U.S. Cl. .................... 134/25.4; 134/25.5; 134/26; 134/30; 134/902; 134/37
[58] Field of Search ............................... 134/2, 25.4, 25.5, 134/26, 30, 37, 32, 902; 34/78

[56] References Cited

U.S. PATENT DOCUMENTS

| | | | |
|---|---|---|---|
| 4,633,893 | 1/1987 | McConnell et al. | 134/95 |
| 4,750,505 | 6/1988 | Inuta et al. | 134/153 |
| 4,778,532 | 10/1988 | McConnell et al. | 134/10 |
| 4,871,417 | 10/1989 | Nishizawa et al. | 156/640 |
| 4,874,014 | 11/1989 | Grant et al. | 137/606 |
| 4,911,761 | 3/1990 | McConnell et al. | 134/11 |
| 4,917,123 | 4/1990 | McConnell et al. | 134/95 |
| 4,984,597 | 1/1991 | McConnell et al. | 134/95 |
| 4,987,687 | 1/1991 | Sugimoto | 34/58 |
| 5,082,518 | 1/1992 | Molinaro | 156/345 |
| 5,129,955 | 7/1992 | Tanaka | 134/2 |
| 5,143,103 | 9/1992 | Basso et al. | 134/98.1 |
| 5,156,174 | 10/1992 | Thompson et al. | 134/153 |
| 5,169,408 | 12/1992 | Biggerstaff et al. | 29/25.01 |
| 5,228,206 | 7/1993 | Grant et al. | 34/1 |
| 5,271,774 | 12/1993 | Leenaars et al. | 134/31 |
| 5,286,657 | 2/1994 | Bran | 437/9 |
| 5,421,905 | 6/1995 | Ueno et al. | 134/25.4 |

FOREIGN PATENT DOCUMENTS

| | | |
|---|---|---|
| 0385536 | 5/1990 | European Pat. Off. . |
| 62-188323 | 8/1987 | Japan . |
| 3-124026 | 5/1991 | Japan . |
| 4-83340 | 3/1992 | Japan . |
| 4-192419 | 7/1992 | Japan . |
| 4-251930 | 9/1992 | Japan . |
| 5-283386 | 10/1993 | Japan . |
| 5-283391 | 10/1993 | Japan . |
| 5-326464 | 12/1993 | Japan . |
| 6-163500 | 6/1994 | Japan . |
| 6-163501 | 10/1994 | Japan . |

OTHER PUBLICATIONS

D. J. Riley and R. G. Carbonell, "The Deposition of Contaminants from Deionized Water onto Hydrophobic Silicon Wafers", Journal of the IES, pp. 28–34, Nov./Dec. 1991.

N. D. Casper and B. W. Soren, "Semiconductor Yield Enhancement through Particle Control", Emerging Semiconductor Technology, pp. 423–435 No Date.

M. Itano, F. W. Kern, Jr., R. W. Rosenberg, M. Miyashita, I. Kawanabe, and T. Ohmi, "Particle Deposition and Removal in Wet Cleaning Processes for ULSI Manufacturing", IEEE Trans. on Semiconductor Manufacturing, vol. 5, No. 2, pp. 114–120, May 1992.

(List continued on next page.)

Primary Examiner—Zeinab El-Arini
Attorney, Agent, or Firm—Townsend and Townsend and Crew LLP

[57] ABSTRACT

A method for drying articles with flat surfaces such as a semiconductor wafer. The method includes steps of immersing a semiconductor wafer in a liquid such as water, and displacing the liquid with a gaseous mixture. The liquid is displaced adjacent to a face of the wafer as measured from the face. A step of pulsing drying fluid directed at wafer edges is also included. The method dries wafers without the use of any harmful organic solvents and the like, and also dries wafers without substantial movement.

44 Claims, 7 Drawing Sheets

OTHER PUBLICATIONS

Y. Yagi, T. Imaoka, Y. Kasama, and T. Ohmi, "Advanced Ultrapure Water Systems with Low Dissolved Oxygen for Native Oxide Free Wafer Processing", IEEE Trans. On Semiconductor Manufacturing, vol. 5, No. 2, pp. 121–127, May 1992.

H. G. Parks, J. F. O'Hanlon, and F. Shadman, "Research Accomplishments at the University of Arizona Sematech Center of Excellence for Contamination/Defect Assessment and Control", IEEE Trans. on Semiconductor Manufacturing vol. 6. No. 2, pp. 134–142, May 1993.

C. S. Ackerman and J. M. Fabia, "Monitoring Supplier Quality at PPM Levels", IEEE Trans. on Semiconductor Manufacturing, vol. 6. No. 2, pp. 189–194, May 1993.

G. D. Moss, J. N. DiBello, K. P. Yanders, and R. F. Orr, "Capillary Drying: Particle–Free Wet–Process Drying?" No Date.

T. Ohmi, Ultra Clean Technology Handbook, p. 290, 1993.

J. Marra, "Ultra Clean Marangoni Drying", pp. 269–282 No Date.

C. McConnell, "Examining the Effects of Wafer Surface Chemistry on Particle Removal Using Direct–Displacement Isopropyl Alcohol Drying", MicroContamination, Feb. 1991.

P. Burggraaf, "Keeping the 'RCA' in Wet Chemistry Cleaning", Semiconductor International, pp. 86–90, Jun. 1994.

M. B. Olesen, "A Comparative Evaluation of the Spin Rinser/Dryer with the IPA Vapor Isodry Technique", Proceedings–Institute of Environmental Sciences, pp. 229–241, 1990.

METHOD FOR CLEANING AND DRYING A SEMICONDUCTOR WAFER

CROSS-REFERENCE TO RELATED APPLICATIONS

This application is a continuation-in-part of application Ser. No. 08/339,326, filed Nov. 14, 1994, in the name of the present assignee and now pending.

BACKGROUND OF THE INVENTION

The present invention relates to the field of semiconductor integrated circuits. The invention is illustrated in an example with regard a semiconductor integrated circuit wet processing method and apparatus, but it will be recognized that the invention has a wider range of applicability. Merely by way of example, the invention can also be applied to the manufacture of raw wafers, disks and heads, flat panel displays, microelectronic masks, and other applications requiring high purity wet processing such as steps of rinsing, drying, and the like.

Industry utilizes or has proposed various techniques to rinse and dry a semiconductor wafer. An example of a conventional technique used to rinse a wafer is a cascade rinse. The cascade rinse utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer.

A limitation with the cascade rinser is "dirty water" often exists in the first chamber. The dirty water typically includes residual acid as well as "particles" which often attach to the wafer. These particles often cause defects in the integrated circuit, thereby reducing the number of good dies on a typical wafer. Another limitation with the cascade rinser is wafers from the cascade rinser must still undergo a drying operation. A subsequent drying operation often introduces more particles onto the integrated circuit. More particles on the integrated circuit typically further decrease the number of good dies on the wafer.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. A limitation with this type of dryer is its use of the large solvent quantity which is highly flammable and extremely hazardous to health and environment. Another limitation with such a dryer is its cost, which is often quite expensive. Still further, it has been determined that large quantities of hot solvent are typically incompatible with certain resist patterned wafers, and are also detrimental to certain device structures.

Still another technique relies upon a hot DI process water to rinse and promote drying of the semiconductor wafer. By way of the hot deionized (DI) water, the liquid on the wafer evaporates faster and more efficient than standard room temperature DI water. However, hot water often introduces stains on the wafer, and also promotes build-up of bacterial and other particles. Hot water can also create damage to the semiconductor, thereby reducing the amount of good dies on the wafer. Another limitation is water is often expensive to heat, and hot DI water is also an aggressive solvent. As an aggressive solvent, it often deteriorates equipment and facilities, thereby increasing maintenance operation costs.

Still a further technique relies upon a technique known as a Marangoni-type drying process. An example of the Marangoni-type drying process is described in J. Marra, ULTRACLEAN MARANGONI DRYING, *Particles in Gases and Liquids 3: Detection, Characterization, and Control*, Edited by K. L. Mittal, Plenum Press, N. Y., 1993, which is hereby incorporated by reference for all purposes. A limitation with the Marangoni-type drying process is small droplets of fluid such as water still remain along wafer edges, typically at a location where the wafer edges meet the wafer carrier. The small droplets on the wafer tend to attract particles which are often detrimental to integrated circuit devices.

As line size becomes smaller and the complexity of semiconductor integrated circuits increases, it is clearly desirable to have a rinse/dry method and apparatus that actually removes particles, prevents additional particles, and does not introduce stains on the wafers. The rinse/dry technique should also dry the wafers, without other adverse results. A further desirable characteristic of a dryer includes reducing or possibly eliminating the residual water left on wafer surfaces and edges when water is removed (a meniscus). The water left on such surfaces and edges often attracts and introduces more particles onto the semiconductor wafer. The aforementioned conventional techniques often fail to provide such desired features, thereby reducing the die yield on the semiconductor during wet processes.

From the above, it is seen that a rinse/dry method and apparatus for semiconductor integrated circuits that is safe, efficient, and economical is often desired.

SUMMARY OF THE INVENTION

The present invention provides a safe, efficient, and economical method and apparatus to rinse and dry a semiconductor wafer. In particular, the present method provides an improved technique that actually reduces the amount of particles from the semiconductor wafer and also effectively dries the semiconductor. The present method also provides an in situ rinse/dry system with substantially no mechanical movement of the wafer.

In a specific embodiment, the present invention provides a method for drying a semiconductor wafer. The present invention includes immersing a partially completed semiconductor wafer in a liquid including water. The partially completed wafer includes front and back faces and an edge. The present invention further includes a step of displacing the liquid with a gaseous mixture. The liquid is displaced adjacent to the front face of the partially completed wafer. A further step of pulsing a drying fluid directed at the edge of the partially completed semiconductor is also included. The drying fluid removes the liquid from the edge.

In an alternative embodiment, the present invention provides an apparatus for drying a semiconductor wafer. The present apparatus includes a vessel adapted to immerse a partially completed semiconductor wafer in a liquid comprising water. The partially completed wafer includes front and back faces, and an edge. The present apparatus further includes a control valve operably coupled to the vessel and adapted to displace the liquid in the vessel with a gaseous mixture. The present apparatus includes the step of displacing the liquid adjacent to the front face of the partially completed wafer. The present apparatus further includes a controller operably coupled to a plurality of nozzles and adapted to pulse a drying fluid from the plurality of nozzles to the edge of the partially completed semiconductor wafer. The nozzles pulse the drying fluid to remove the liquid from the edges.

A further alternative embodiment provides a method for drying a semiconductor wafer. The present method includes immersing a partially completed semiconductor wafer in a liquid having water, and displacing the liquid with a gaseous mixture. The liquid is displaced adjacent to a wafer face of the partially completed wafer. The displacing step occurs at a rate not exceeding about 2.5 mm/sec. as measured from the wafer face. In a further embodiment, the rate is at about 2.00 mm/sec. or less as measured from the wafer face, and is preferably at about 0.80 mm/sec. or less.

A further understanding of the nature and advantages of the present invention may be realized by reference to the latter portions of the specification and attached drawings.

DESCRIPTION OF THE SPECIFIC EMBODIMENT

Figure 1:
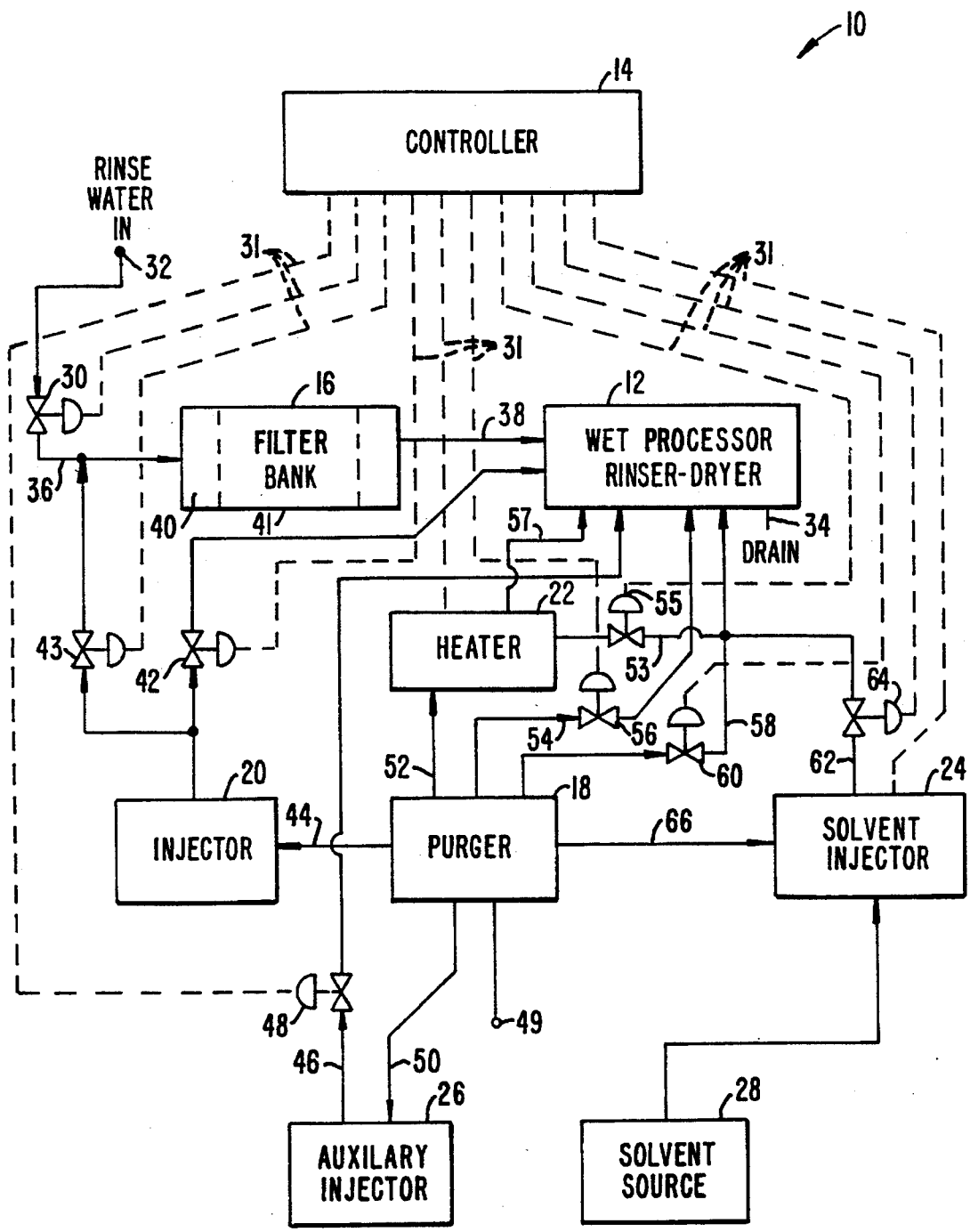
FIG. 1 is a simplified block diagram of an embodiment of the rinse/dry system according to the present invention.

FIG. 1 illustrates in block diagram form an embodiment of the rinse/dry system 10 according to the present invention. The system 10 includes elements such as a wet processor (rinser/dryer) 12, a controller 14, a filter bank 16, a purger 18, an injector 20, a heater 22, a solvent injector 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a wafer fabrication plant.

The filter bank can be any suitable combination of filters, typically used for point of use applications. The filter bank connects to the rinse water source through a line 36 and connects to the wet processor through a line 38. The filter bank includes an ultraviolet purification unit 40, a filter combination of charged and neutral filters 41, among others.

An example of charged filters are described and illustrated in application Ser. No. 08/285,316, filed Aug. 3, 1994, Attorney Docket No. 13944-701, entitled METHOD AND APPARATUS FOR DELIVERING ULTRA-LOW PARTICLE COUNTS IN SEMICONDUCTOR MANUFACTURING (hereinafter "METHOD AND APPARATUS FOR DELIVERING ULTRA-LOW PARTICLE COUNTS IN SEMICONDUCTOR MANUFACTURING") assigned to the present assignee, and hereby incorporated by reference for all purposes. The filter bank provides for ultra-purified DI water with particles no greater than 0.5 microns in diameter, and preferably 0.1 microns in diameter and less.

The filter bank also provides for a nominal pressure drop therethrough. The pressure drop is less than about 15 pounds per square inch, and preferably less than about 5 pounds per square inch. A higher flow rate is achieved through the filter bank without auxiliary pumps or flow/pressure enhancing devices.

The injector 20 can be any suitable injector for reducing or preferably eliminating bacteria or any living organisms from the lines and system elements. Preferably, the injector 20 is a hydrogen peroxide injector. An example of a hydrogen peroxide injector is discussed in METHOD AND APPARATUS FOR DELIVERING ULTRA-LOW PARTICLE COUNTS IN SEMICONDUCTOR MANUFACTURING. The hydrogen peroxide injector connects to at least the filter bank 20 via source line 32 and the wet processor 12. A control valve 42 meters hydrogen peroxide into the wet processor 12, and a control valve 43 meters hydrogen peroxide into the filter bank 16. Preferably, the controller 14 meters such hydrogen peroxide into the system elements such as the wet processor 12 and the filter bank 16, among others during system maintenance, and other desirable times. The injector also connects via line 44 to the purger 18. The purger provides clean pressurized gas to the injector to allow such hydrogen peroxide to be introduced into the aforementioned system elements without other auxiliary devices. Of course, the type of injector used depends upon the particular application.

A use of another chemical such as a solvent, conventional acid, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the METHOD AND APPARATUS FOR DELIVERING ULTRA-LOW PARTICLE COUNTS IN SEMICONDUCTOR MANUFACTURING. Of course, the type of auxiliary injector used depends upon the particular application.

A further system element is the purger 18, often used to supply gas and/or pressure to certain system elements such as the wet processor, and others. The purger can be any suitable type of pressure reduction and/or control means capable of supplying the source gas to certain system elements at the desired pressure and flow rate. The purger connects to a source gas 49 which is often a carrier gas used in the rinse/dry system.

Preferably, the carrier gas is an ultra-purified or electronic grade nitrogen gas, or any suitable carrier gas capable of carrying a certain polar organic solvent into the wet processor at a desired temperature, pressure, and flow rate. The suitable carrier gas also includes a high purity level to prevent contamination of the system elements. An example of a purger is illustrated in the METHOD AND APPARATUS FOR DELIVERING ULTRA-LOW PARTICLE COUNTS IN SEMICONDUCTOR MANUFACTURING. As previously noted, the purger also supplies pressurized carrier gas or pressure to the injector 20 and auxiliary injector 26 through lines 44 and 50, respectively. The purger further supplies carrier gas to the wet processor through certain alternative routes.

A typical route connects the purger 18 to the wet processor 12 through the heater 22 via lines 52 and 57. In this route, the carrier gas is heated at the heater 22 before entering into the wet processor 12 through the line 57. The heater can be any suitable commercially available or custom made heater capable of heating the carrier gas such as nitrogen to a temperature at the wet processor 12 greater than 70° F. and preferably greater than 150° F., but no greater than 200° F. The controller is operably coupled to the heater to adjust the temperature of the carrier gas and turn-on and turn-off the carrier gas at the desired times. The controller also meters the carrier gas into the wet processor at a desired flow rate and time.

Alternatively, the heated carrier gas connects to the solvent injector 24 through a line 53, before entering the wet processor 12. The heated carrier gas mixes and dilutes solvent from the solvent injector 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn-on and turn-off the carrier gas at the desired times. The controller 14 and the control valve 56 also meter the carrier gas into the wet processor 12 at a desired flow rate and time.

In a further alternative route, the purger 18 connects to the solvent injector 24 through a line 58 before entering the wet processor 12. In this route, the carrier gas mixes with solvent from the solvent injector 24 before entering the wet processor 12. The controller is operably coupled to a control valve 60 that meters the carrier gas to the wet processor through the line 58. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes for desired applications. An example of a suitable controller is illustrated in the METHOD AND APPARATUS FOR DELIVERING ULTRA-LOW PARTICLE COUNTS IN SEMICONDUCTOR MANUFACTURING. Of course, the type of controller used depends upon the particular application.

The solvent injector 24 supplies solvent typically with a carrier gas to the wet processor 12 through a line 62. The purger 18 supplies the carrier gas to the solvent injector through a line 66. To regulate or meter the flow of the solvent into the wet processor, the controller operably couples a control valve 64 connected to the line 66, attached to the solvent injector. The system also provides the solvent source 28 such as bottle or canister of the desired chemical.

Figure 2:
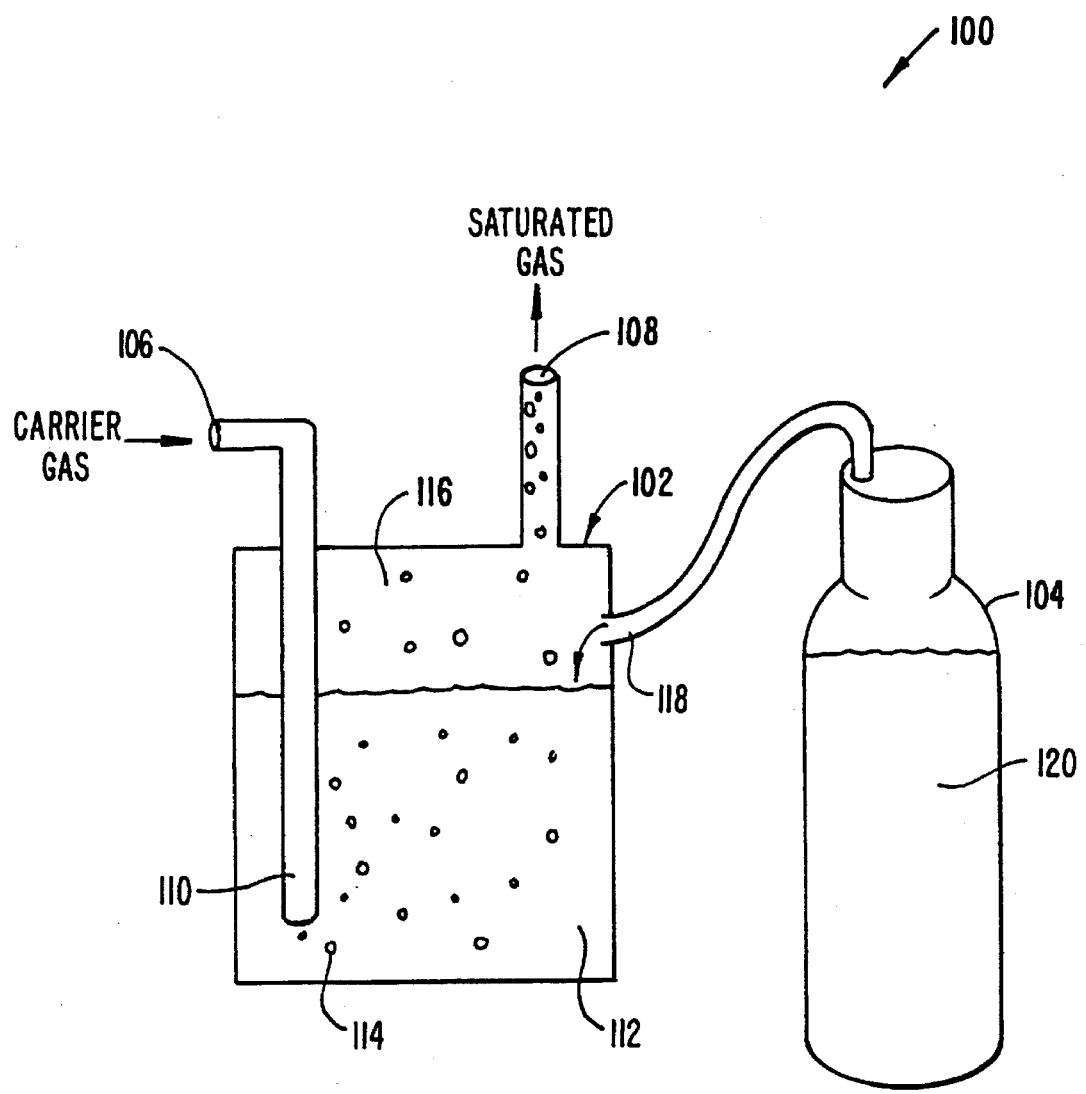
FIG. 2 is a simplified cross-sectional view of a solvent injector according to the present invention.

The solvent injector can be any suitable solvent injector system for use with the wet processor, carrier gas, and solvent. An example of a solvent injector system is represented by the simplified illustration of FIG. 2. The solvent injector system 100 includes a solvent injector vessel 102 and a solvent source 104. The solvent injector vessel 102 connects to a carrier gas source at an inlet 106. A sparger 110 sparges carrier gas 114 as bubbles into the solvent 112 at a lower portion of the solvent injector vessel. As the carrier gas bubbles float up through the solvent, the carrier gas bubbles become saturated with solvent. Carrier gas bubbles saturated with solvent escape into the vapor head space 116 of the solvent injector vessel 102, and exit the solvent injector vessel through outlet line 108. A solvent fill inlet 118 is also connected to the solvent injector vessel 102. A solvent source 104 and solvent 120 are further shown.

Figure 3:
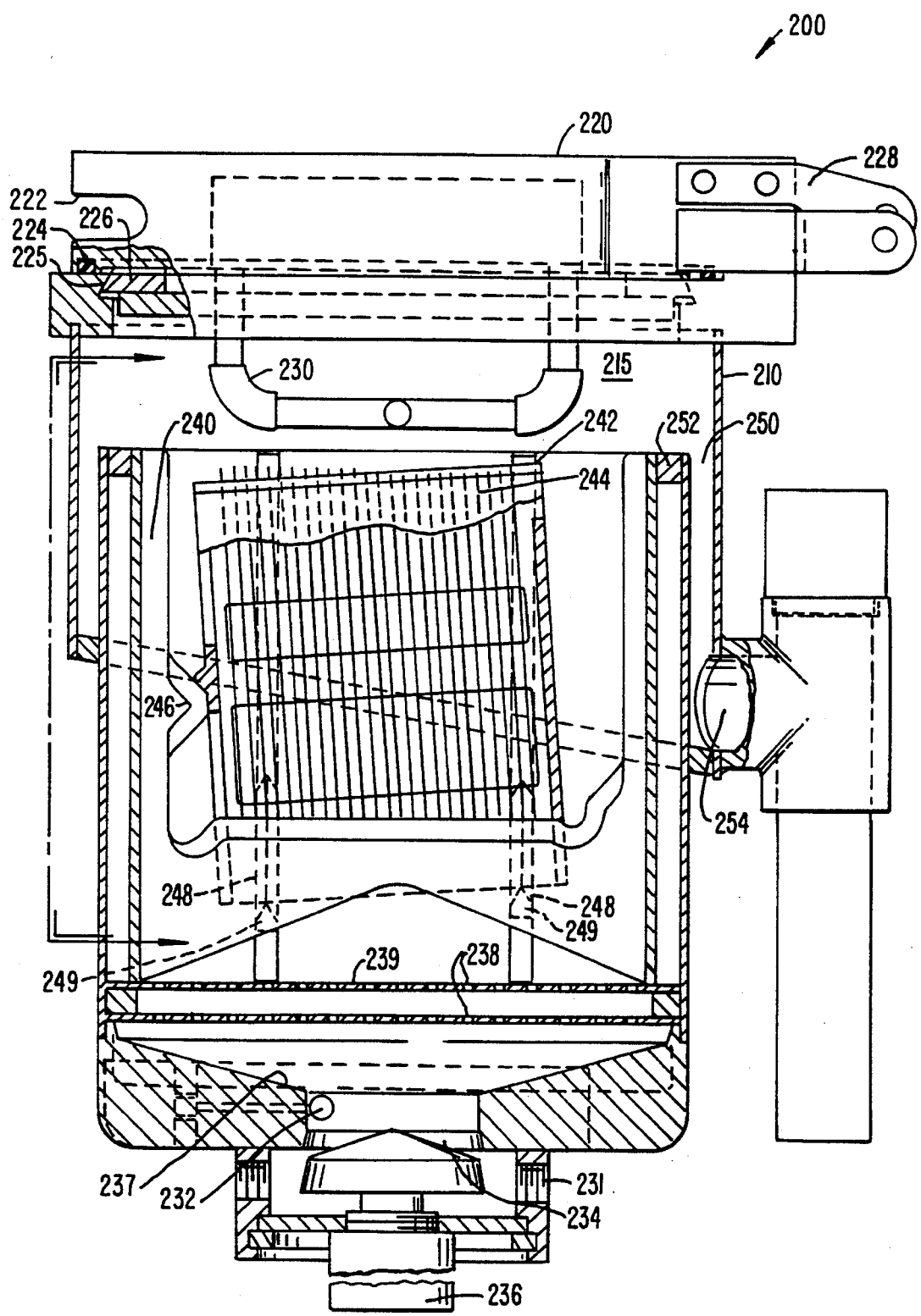
FIG. 3 is a simplified cross-sectional side-view of an embodiment of the rinse chamber.

FIG. 3 is a simplified cross-sectional side-view 200 embodiment of the rinse/dry chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 is also shown. Of course, other chamber elements may also be present depending upon the particular application.

The lid 220 is preferably a sealed lid. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

The process region 240 includes a wafer carrier 242, wafer carrier support 246, 248, and wafer support 249. As will be described in greater detail below, the wafer carrier and wafer support are configured and arranged to minimize liquid accumulation as liquid is drained away in the drying process.

The wafer carrier is a wafer boat or alternatively a half wafer boat or any other type of wafer carrier with a lower profile. The half wafer boat or lower profile boat holds or accumulates less liquid than its full boat counterpart, and therefore drains liquid faster and more easily. The wafer carrier includes wafers 244 disposed within the supports of the wafer carrier. The wafer carrier is supported by a side wafer carrier support 246 and bottom wafer carrier support 248. The side wafer carrier support holds the wafer carrier in place, and prevents such wafer carrier from excessive movement. As shown, the bottom wafer support tilts the wafer carrier in a slight angle from a horizontal position. The angle tends to prevent wafers from sticking to each other during certain rinse and dry operations. The angle from the horizontal position ranges from about 2° to about 15° and is preferably determined by the characteristics of the particular carrier. By keeping each of the wafers separated, liquid does not accumulate therebetween, thereby decreasing the amount of liquid and therefore particles from accumulating on the wafer.

Each wafer carrier support includes a contact point on the wafer carrier to drain liquid such as water from the wafer carrier surface. The contact point is typically a knife edge, serrated edge, or any other shape that breaks the surface tension of the liquid on the wafer carrier surface. By breaking the surface tension of the liquid on the wafer carrier, the liquid with particles drains (or "wicks") off of the wafer carrier more easily. Removing the liquid with particles from the wafer carrier tends to promote drying and rinsing of each of the wafers in a particle free manner.

The wafer support 249 provides lift and a contact point to each of the wafers 244 within the wafer carrier. To more easily appreciate the features of the wafer support, it should be noted that each of the wafers in a conventional wafer carrier touches the wafer carrier in at least three large regions. Each of the wafers is also relatively close to the insides of the wafer carrier. Accordingly, liquid easily accumulates and is often trapped on edges of each of the wafers.

To reduce this effect, the wafer support lifts the wafers in the wafer carrier by elevating each of the wafers in the carrier with a knife edge. By lifting each of the wafers in the wafer carrier, the wafer edges are further away from insides of the carrier, thereby allowing liquid to flow free from the region between the wafer edges and carrier insides. To further promote the removal of liquid from each of the wafers, the knife edge is preferably pointed, serrated, or any other shape that easily breaks the surface tension of the liquid at the bottom of each wafer. By breaking the surface tension of liquid at the wafer bottom edges, liquid flows free from the wafer bottom edges, thereby reducing the meniscus at such edges. The knife edge lifts each of the wafers at least 2 mm from the bottom insides of the carrier, and preferably lifts each of the wafers about 5 mm, but no more than about 20 mm. The wafer carrier support removes liquid such as water from the wafers, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the wafer carrier support.

A cascade region 250 allows liquid to cascade out into cascade drain region 253. To rinse certain chemicals from the wafer carrier and wafers, ultra-purified DI water enters through the fill inlet 237, rises through the drain holes 238, flows through the process region 240, and cascades over a partition 252 into the cascade drain region 253. This sequence of steps removes excess chemicals such as acids or the like from the wafer carrier and wafers, and also keeps such chemicals from accumulating in the main chamber and in particular the process region.

Figure 4:
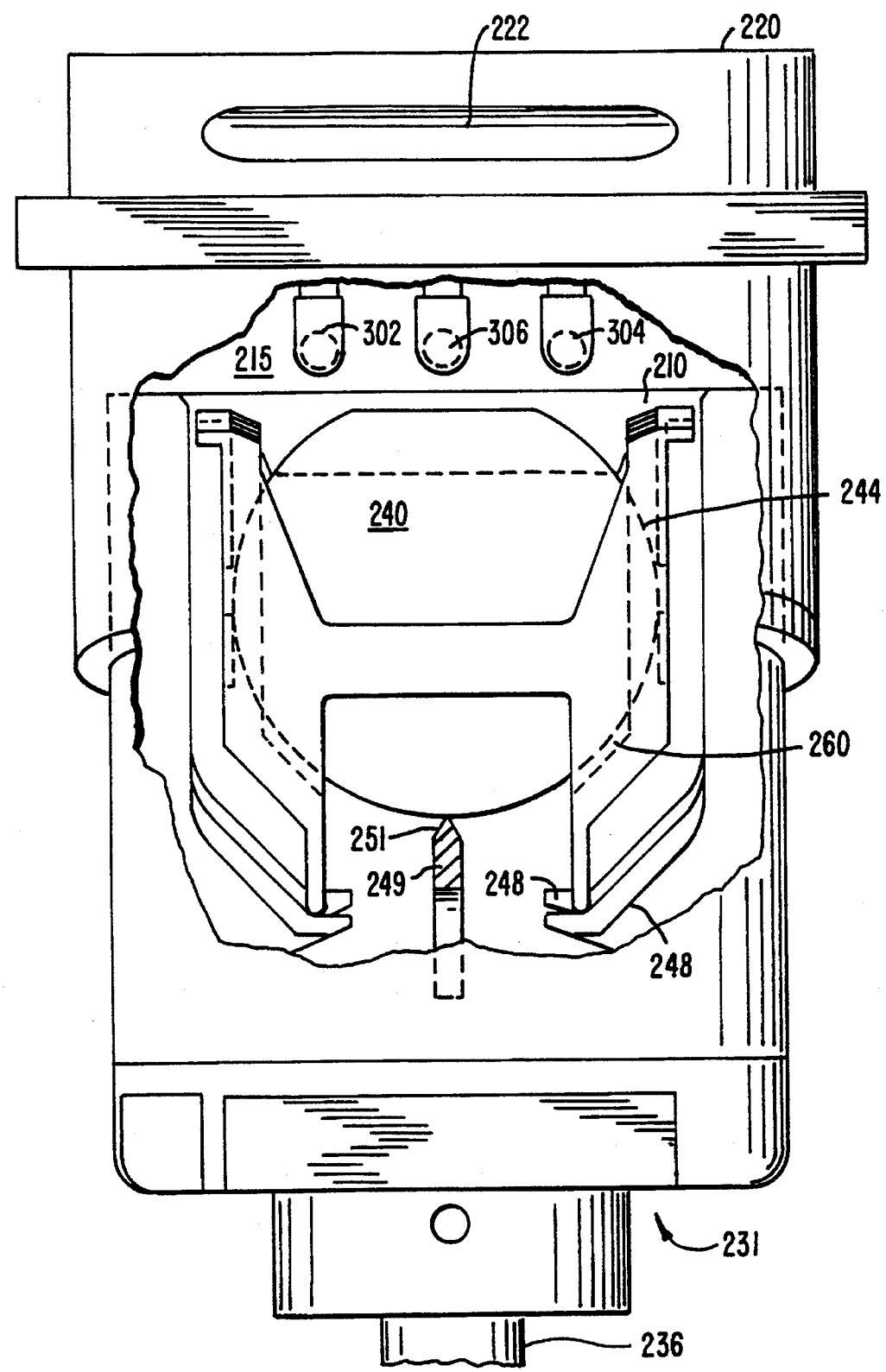
FIG. 4 is a simplified cross-sectional front-view of an embodiment of the rinse chamber.

FIG. 4 illustrates a simplified front view of the rinse/dry chamber according to the present invention. For easy reading, FIG. 4 uses some of the same reference numerals as the FIG. 3 embodiment. The front-view embodiment shows elements such as the main chamber 210, the lid 220, the lower drain region 231, the process region 240, among others. The main chamber 210 includes the process region 240 and upper chamber region 215.

As shown, the wafer support 249 lifts each of the wafers from the wafer carrier to form a gap 260 between wafer edges and wafer carrier insides. The gap prevents liquid from accumulating between such wafer edges and wafer carrier insides. The gap is no greater than about 20 mm, but is larger than about 2 mm. The wafer support is a knife edge with triangular point 251. Other shapes may also be used to break the meniscus at the bottom of the wafer edges and remove water therefrom. The meniscus often forms at the bottom wafer and surface edges as liquid is being removed from the wafers. As previously noted, the meniscus often contains particles, often detrimental to the manufacture of an integrated circuit.

The front view embodiment also shows the wafer carrier supports 248. As shown, each of the wafer carrier support is arranged with different heights, typically lower to higher from one side of the process region to the other side of the process region. The different heights of the wafer carrier support tilt the position of the wafer carrier from horizontal. The tilt or angle of the wafer carrier also tilts the wafers, thereby preventing such wafers from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside carrier gas inlets 302 and 306, and a center solvent gas inlet 304. The carrier gas inlet provides ultra-pure nitrogen to purge the main chamber from the environment, thereby creating an ultra-clean main process region. Of course, the number of inlets and their use depend upon the particular application.

Figure 5:
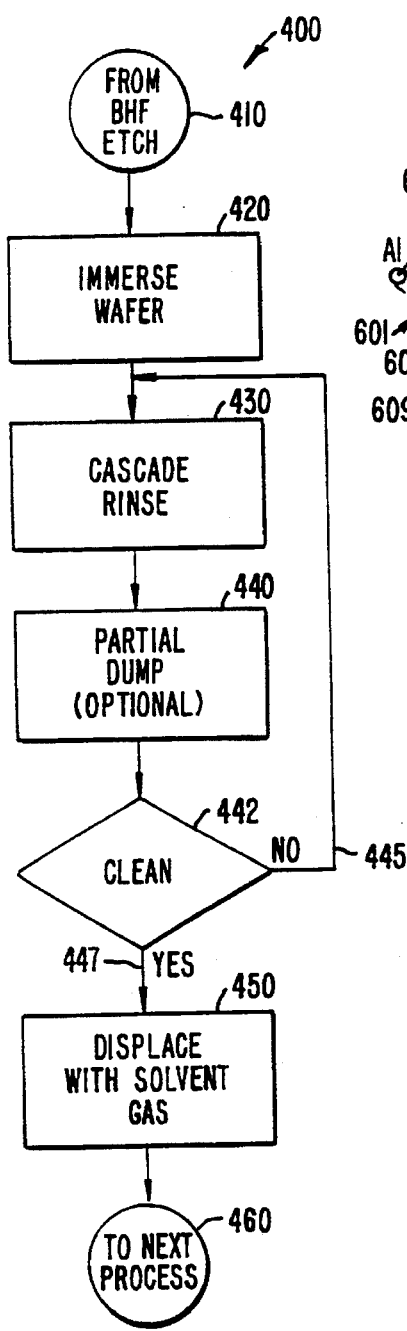
FIG. 5 is a simplified flow diagram of an embodiment of the rinse/dry method according to the present invention.

FIG. 5 is a simplified flow diagram 400 of an embodiment of a rinse/dry method according to the present invention. The rinse method is illustrated as a rinse/dry method for a recently wet etched wafer. The wet etched wafer for illustrative purposes only is etched in a solution of hydrofluoric acid (HF) or buffered hydrofluoric acid (BHF). Hydrofluoric acid is often used to remove oxides from surfaces of a semiconductor wafer. As merely an example, this embodiment should not be taken as limiting the scope of the present invention.

The flow diagram begins 400 by receiving a recently etched wafer (etched wafer) 410 from the BHF etch. The etched wafer has no oxide layer thereon from the BHF etch, and is predominately hydrophobic in characteristic. A step 420 of immersing the etched wafer in the bath of ultra-purified DI water follows. The etched wafer is immersed into the DI water from the acid bath in about 5.0 seconds or less, and preferably about 2.5 seconds and less.

The step of immersing the etched wafer immediately into the DI water substantially prevents formation of silicon dioxide from the oxygen in air, and promotes the formation of a thin but clean high grade silicon dioxide layer from the ultra-purified DI water. The DI water is substantially free from particles and therefore forms a substantially particle free silicon dioxide layer.

To remove acid such as the HF from the surface of the wafer, the ultra-purified DI water in the main chamber (or vessel) flows across the wafer and cascades over into a drain. The DI water cascade carries excess acid into the drain and reduces the acid concentration in the vessel.

Optionally, the DI water in the vessel may be removed by dumping it (step 440) into a bottom drain dump. Preferably, the dumping step is a partial dump, and not a complete dump or removal of DI water. During the removal of the DI water, a clean inert gas displaces the DI water. A typical inert gas includes filtered nitrogen and others.

After displacing the DI water with the clean inert gas, clean DI water from the DI water source flows into the main chamber to cover the surface area of the wafer. These aforementioned steps may be repeated (branch 445) alone or in any combination until substantially no residual acid exists (test 442) on the wafer.

When residual acid has been substantially removed from the wafer, a carrier gas including a polar organic compound displaces 450 the DI water. The carrier gas is preferably nitrogen with a trace of polar organic compound such as isopropyl alcohol, 1-methoxy-2-propanol, di-acetone alcohol, and others. The carrier gas is also substantially free from particles of about 0.20 microns to about 0.15 microns, and is preferably free from particles of about 0.10 microns or less. For a typical batch of wafers in a conventional wafer boat, the amount of organic solvent used is preferably less than a milliliter.

The trace of polar organic compound is made by mixing the carrier gas with a saturated bubble of polar organic compound. The saturated polar organic compound bubble is made by flowing cold or warm nitrogen through a solution of polar organic compound at a rate of about 3 cubic feet/min. or less. The saturated polar organic compound bubble then mixes with either cold nitrogen at a flow rate of about 5 cubic feet/min. and less, or hot nitrogen at a flow rate of about 10 cubic feet/min. and less. A temperature of such hot nitrogen carrier gas is at about 70° F. and higher but not greater than 250° F., and is preferably about 185° F. and less. By mixing nitrogen gas with the saturated polar organic compound bubble, the polar organic compound is a non-saturated vapor in the main chamber.

The carrier gas including the polar organic compound comes in contact with the DI water which is being drained at a slow rate removing water from the surface of the wafer, and also tends remove particles from such wafer via the DI water. A carrier gas including isopropyl alcohol, di-acetone alcohol, or other polar organic solvents displaces the DI water at a rate of about 4 mm/second or less as measured from the wafer face, and is preferably at a rate of about 1 mm/second and less. The carrier gas including the polar organic compound is believed to remove a portion of the liquid on the wafer surface through the Marongoni effect. The Marongoni effect tends to increase flow of liquid from the wafer surface through use of a solvent vapor, but may not remove all liquid from the wafer surface.

In alternative embodiments, the carrier gas is substantially free from any polar organic compounds, organic compounds, or the like. Like the previous embodiments, the carrier gas displaces the DI water (step 450) being drained, removing water from the surface of the wafer, and also tends remove particles from such wafer via the DI water. The carrier gas displaces the DI water at a rate of about 2.50 mm/second or less as measured from the wafer face, and is preferably at a rate of about 1.25 mm/second and less, and is more preferably at a rate of about 0.60 mm/second or less. In such embodiments, the present invention uses substantially no harmful solvents or the like, and is therefore even more safe, efficient, and economical.

A step of pulse flow drying (step 460) is performed on the wafer and carrier for further drying, if necessary. The step of pulse flow drying substantially removes all liquid droplets adhering to surfaces such as wafer edges, carrier edges, and the like. The step of pulse flow drying occurs by way of high velocity flow apparatus 600 illustrated in FIG. 6. The high velocity flow apparatus can be adapted into the present rinse chamber 200 among other systems. The high velocity flow apparatus includes a plurality of nozzles 601 directed over a wafer carrier 242. The wafer carrier 242 includes a plurality of wafers 244, each having residual amounts of liquid at their edges. Each wafer may have a liquid volume ranging from about 1.0 milliliter to about 0.2 milliliter but is preferably less than about 0.5 milliliter. The plurality of nozzles 601 is defined by a first set of nozzles 603 (first nozzle set), a second set of nozzles 605 (second nozzle set), and others.

The first nozzle set 603 is directed to the front side 607 of the wafers 244. The first nozzle set directs drying fluid at wafer edges 609 adjacent to the wafer carrier sides 246. The drying fluid can be any suitable fluid capable of removing liquid from the wafer edges and wafer surfaces. The drying fluid is preferably ultra clean nitrogen and the like, but may also be a variety of other gases or gaseous mixtures. The first nozzle set preferably includes at least two nozzles, each placed at a location to direct drying fluid towards the wafer edges 609 adjacent to the wafer carrier sides. In the first nozzle set, a first nozzle A1 611 is directed to the wafer edges 609 at one side of the wafer carrier, and a second nozzle A2 615 is directed to the wafer edges 609 at the other side of the wafer carrier.

The second nozzle set 605 is directed to the back side 619 of the wafers 244. The second nozzle set directs drying fluid at wafer edges 609 adjacent to the wafer carrier sides 246. The second nozzle set preferably includes at least two nozzles, each placed at a location to direct drying fluid towards the wafer edges adjacent to the wafer carrier sides. In the second nozzle set, a first nozzle B1 621 is directed to the wafer edges at one side of the wafer carrier, and a second nozzle B2 625 is directed to the wafer edges at the other side of the wafer carrier.

Figure 6:
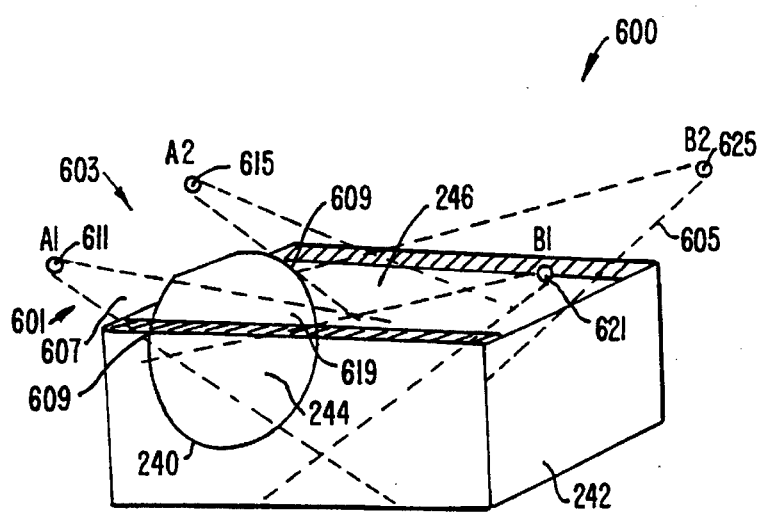
FIG. 6 is a simplified diagram of a high velocity flow apparatus according to the present invention.
Figure 7:
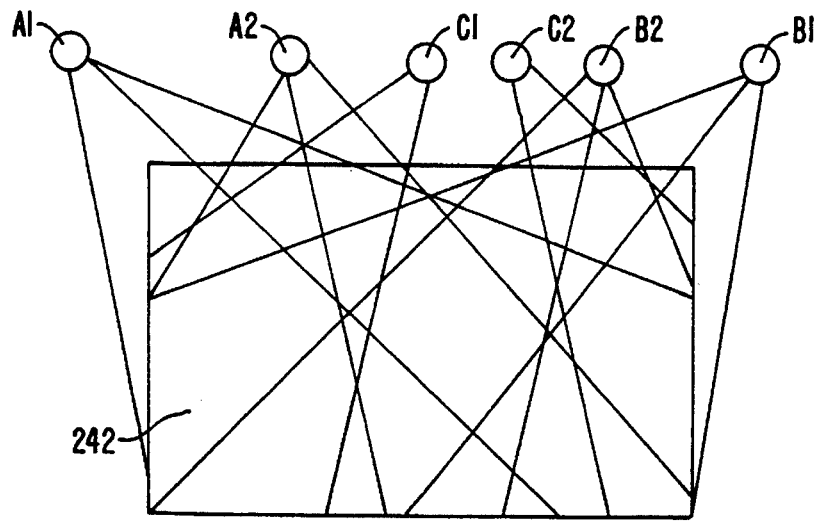
FIGS. 7 and 8 are simplified fluid flow diagrams of the high velocity flow apparatus of FIG. 6.
Figure 8:
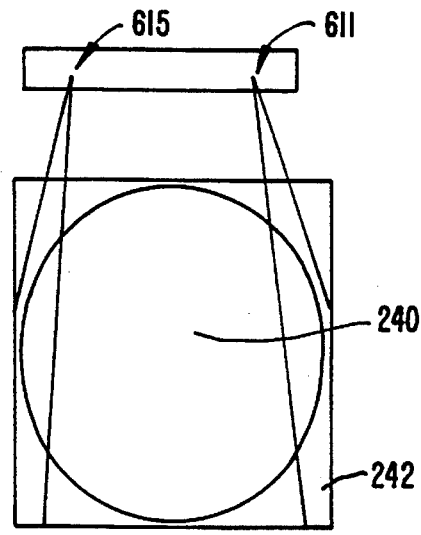

The nozzle can be any suitable nozzle capable of enabling the drying fluid to flow over the wafer edges and remove liquid therefrom as illustrated by fluid flow distribution patterns in FIGS. 7 and 8. FIG. 7 illustrates a simplified side-view diagram of the apparatus of FIG. 6 according to the present invention. As shown, nozzles A1, A2, B2, and B3 direct drying fluid at the wafer edges (not shown) to preferably cover the inner surface area of the wafer carrier 242. Optionally, the apparatus can also include additional nozzles C1 and C2. Nozzles C1 and C2 are directed toward the wafer carrier front and back sides.

Figure 6A:
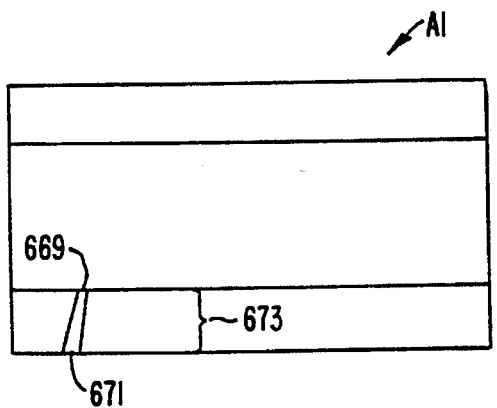
FIGS. 6A and 6B illustrate simplified diagrams of a nozzle according to the present invention.
Figure 6B:
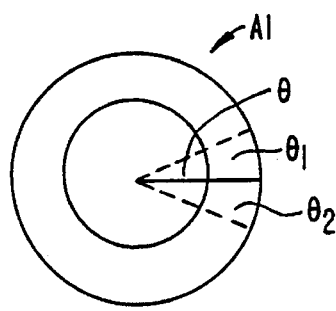

FIG. 8 illustrates a simplified front-view diagram of the nozzles A1 and A2 for the apparatus of FIG. 6 according to the present invention. Nozzles A1 and A2 direct drying fluid at the wafer edges along a front portion of the wafers. The nozzle is preferably narrow and long to produce a fluid flow at high velocity to cover the desired number of wafers. Each nozzle produces a fluid flow of, for example, nitrogen gas ranging from about 250 to about 350 standard cubic feet per hour, and is preferably about 300 standard cubic feet per hour. The pressure of the nitrogen gas at the nozzle opening ranges from about 80 to about 90 psia, and is preferably about 85 psia. A nozzle A1 also includes an opening 669 having a width of about 0.025 inch and a height of about 0.375 inch 673 as illustrated in FIGS. 6A and 6B. As shown, FIG. 6A illustrates a simplified cross-sectional side view of the nozzle, and FIG. 6B illustrates a simplified cross-sectional front view of the nozzle. The nozzle opening 671 includes an angle θ ranging from about 20 degrees to about 80 degrees, but is preferably about 75 degrees and less. The angle θ may also be defined by a first angle $θ_1$ and second angle $θ_2$. The first angle may be different from the second angle but can also be the same. Of course, other flow rates, pressures, and nozzle dimensions can be used depending upon the particular application.

Each nozzle is positioned to direct drying fluid to the wafer edges and portions of the wafer surface. The nozzle is directed to an inner edge of the wafer carrier to promote the removal of liquid between the wafer edges and the carrier sides. The nozzle is defined between about 0.5 inch to about 2 inches from an outside edge of the wafer carrier. The nozzle is placed at an angle from about 5° to about 85° and is preferably about 45° from a line perpendicular from the wafer surface. Of course, the exact angle used depends upon the particular application.

Drying occurs by directing drying fluid from the first nozzle set and the second nozzle set in an alternating sequence against the wafer edges and portions of the wafer surfaces. For example, the first nozzle set sends a pulse of drying fluid against the wafer edges and portions of the front wafer surfaces, then the second nozzle set sends a pulse of drying fluid from the opposite direction against the wafer edges and portions of the back wafer surface. The drying fluid pulses from the first nozzle set and the second nozzle set alternate until no more liquid remains on the wafer edges.

In removing water from the wafer edges, the second nozzle set has a pulse duration which is longer than the pulse duration of the first nozzle set. Water adheres on the backside of the wafer and wafer edges on a conventional semiconductor wafer with a greater attractive force than the front-side of the wafer. Accordingly, it is often preferable to have a pulse duration at the second nozzle set which is at least two times longer than the pulse duration at the first nozzle set. The pulse duration at the second nozzle set can also be three times longer or more than the pulse duration at the first nozzle set. The pulse duration for the first nozzle set ranges from about 1 to 3 seconds and greater, and the pulse duration for the second nozzle set ranges from about 2 to 6 seconds and greater. The amount of pulses is preferably greater than 5 for each wafer side for a total of about 30 seconds of total pulsing time. Of course, other selected pulses among the first and second nozzle sets may also be performed, depending upon the particular application.

Optionally, pulse flow drying is followed by flowing hot nitrogen gas over the wafer carrier (step 470). The hot nitrogen gas is ultra clean nitrogen gas with a temperature at about 70° F. and is preferably greater than 150° F., but no greater than 200° F. The combination of hot nitrogen and pulse flow drying reduces actual drying time by about one half, as compared to drying solely by means of hot nitrogen and the like. Of course, other carrier gases and combinations thereof may also be used depending upon the particular application.

Figure 9:
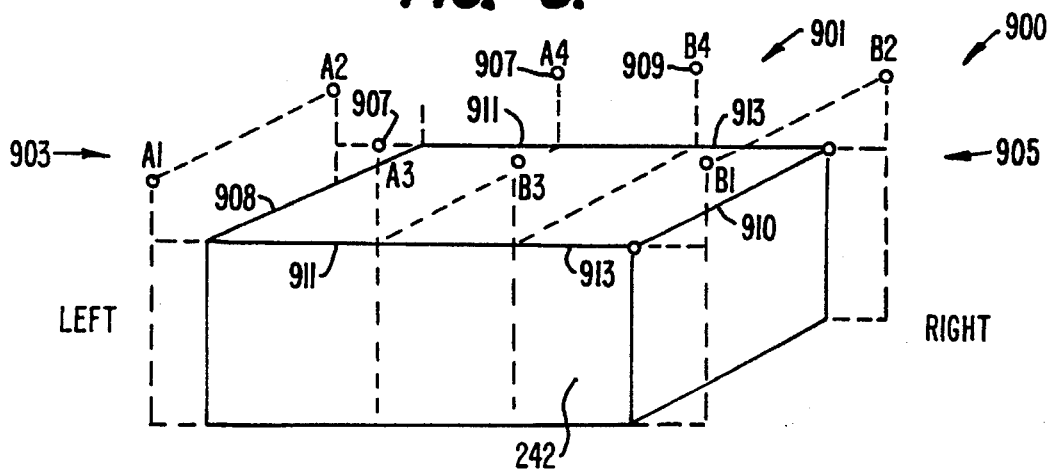
FIG. 9 is a simplified diagram of an alternative embodiment of the high velocity flow apparatus according to the present invention.

FIG. 9 is a simplified diagram 900 of an alternative embodiment of the high velocity flow apparatus according to the present invention. The high velocity flow apparatus includes a plurality of nozzles 901 directed over a wafer carrier 242. The wafer carrier 242 includes a plurality of wafers 244 (not shown), each having residual amounts of liquid at their edges. Each wafer may have a liquid volume ranging from about 1.0 milliliter to about 0.2 milliliter but is preferably less than about 0.375 milliliter. The plurality of nozzles 901 is defined by a first set of nozzles 903 (first nozzle set), a second set of nozzles 905 (second nozzle set), a third set of nozzles 907 (third nozzle set), a fourth set of nozzles 909 (fourth nozzle set), and others.

The nozzles are placed at selected locations surrounding the wafer carrier, and in particular the wafers disposed in the wafer carrier. The first nozzle set A1, A2 is placed at an end 908 of the wafer carrier facing the wafer faces, and the second nozzle set B1, B2, is placed at the other end 910 of the wafer carrier facing the back-side of the wafers. The third nozzle set includes nozzles A3, A4 which face each other and are disposed adjacent to a first portion 911 of the wafer carrier edges. The fourth nozzle set includes nozzles B3, B4 also face each other and are disposed adjacent to a second portion 913 of the wafer carrier edges. The design of each nozzle is similar to the previous embodiment, but each nozzle covers less area than the previous embodiment.

In removing residual water from the wafers, each set of nozzles is pulsed in a selected pattern. For example, the pulse pattern begins by pulsing drying fluid at nozzles A1, A2 followed by nozzles A3, A4 followed by nozzles B1, B2 followed by nozzles B3, B4, and the sequence repeats as often as it is necessary to remove substantially all water from the wafer. Alternatively, the pulse pattern begins at nozzles B3, B4 followed by nozzles B1, B2 followed by nozzles A3, A4 followed by nozzles A1, A2, and the sequence then repeats as often as it is necessary to remove substantially all water from the wafer.

Optionally, the pulse drying is followed by flowing hot nitrogen gas over the wafer carrier. The hot nitrogen gas is ultra clean nitrogen gas with a temperature at about 70° F. and is preferably greater than 150° F., but no greater than 200° F. The hot nitrogen gas flows over the wafers for a period of time of at least 30 seconds and more, or preferably 50 seconds and more. The combination of hot nitrogen and pulse drying reduces actual drying time by about one half, as compared to drying solely by means of hot nitrogen and the like. Of course, other carrier gases and combinations thereof may also be used depending upon the particular application.

Another method to rinse and dry HF etched wafer includes a selected sequence of the aforementioned steps. A solution of HF etches silicon dioxide off the semiconductor wafer. To stop etching, the wafer is quickly immersed into ultra-pure DI water in a vessel. After immersing the etched wafer into the DI water, the vessel is purged with filtered nitrogen gas. The nitrogen gas flows at a rate of ranging from about 1 cubic feet/min. to about 10 cubic feet/min., and is preferably at about 2 cubic feet/min.

To further rinse and remove acid from the wafer, DI water flows past the wafer and cascades from a top portion of the vessel into a drain to cascade rinse the wafer. A quick dump follows the cascade rinse. Preferably, the quick dump occurs at a rate where the liquid level drops at a rate greater than about 20 mm/sec. as measured from a wafer face. During the quick dump, clean nitrogen gas displaces the DI water, thereby preventing any oxidation of the wafer from air. Clean DI water fills the vessel and displaces the nitrogen to re-immerse the wafer in the DI water.

A carrier gas including a polar organic compound then slowly displaces the DI water to remove substantially all acid off the wafer. The slow displacement step substantially eliminates any water from the wafer edges (a meniscus). After another sequence of quick DI water fills and partial dumps, another gaseous mixture including carrier gas and polar organic compound displaces the DI water. Substantially all water is removed from the wafer at this time. To further dry the wafer and carrier, warm or hot nitrogen is pulsed into the vessel. The nitrogen includes a temperature ranging from about 70° F. to about 250° F.

As previously noted, alternative embodiments use a carrier gas without any polar organic compound or the like to displace the DI water. In such embodiments, the carrier gas displaces the DI water at a rate of about 2.50 mm/second or less as measured from the wafer face, and preferably at a rate of about 1.25 mm/second and less, and more preferably at a rate of about 0.80 mm/second or less. The carrier gas without any polar organic compounds or the like may also be nitrogen at a temperature ranging from about 70° F. to about 250° F. To further dry the wafer and carrier, warm or hot nitrogen is pulsed into the vessel. The nitrogen includes a temperature ranging from about 70° F. to about 250° F.

The aforementioned methods also include the use of a certain wafer support and a wafer carrier support to enhance wicking or to draw liquid away from the wafer and carrier. For example, the wafer support includes a knife edge that lifts the wafers to prevent accumulation of water at the wafer edges, and in particular the wafer bottom edges. The wafer carrier support wicks or draws the water from the surface of the wafer carrier, and also puts a slight tilt from horizontal on such carrier.

The slight tilt of the wafer carrier also tilts the wafers, which tends to prevent them from sticking to each other. As previously noted, sticking wafers often accumulate water therebetween. The accumulation of water also accumulates particles, which may be in the water. By removing the water and particles from the wafer, the present method provides higher device yields on a typical semiconductor wafer.

In addition, the aforementioned rinse/dry method occurs without movement of the wafer. In fact, the wafer carrier remains substantially stationary after being immersed, and during the drying, cascade rinse, and other steps. By way of less movement, the system has fewer mechanical parts and is often easier to use and maintain than certain prior art systems.

Moreover, the amount of polar organic compound used for each batch of wafers is typically less than a fraction of a milliliter. The use of less organic compounds is often advantageous to the highly flammable prior art methods of drying a wafer by way of IPA for example. In certain embodiments, no polar organic compounds or the like are used. Accordingly, the present method is less hazardous than certain prior art methods to both health and environment.

EXPERIMENTS

To prove the principle and demonstrate the operation of the present method and apparatus, experiments were performed.

In the experiments, a 6 inch silicon wafer was used as a substrate. The 6 inch silicon wafer included an overlying layer of high quality silicon dioxide, typifying a recently HF etched wafer with an overlying oxide layer. The 5 inch silicon wafer was placed in a wafer carrier, which was immersed into a bath of rinse water in a vessel. In the vessel, the 5 inch silicon wafer was at a substantially vertical position, that is, faces of the wafer were substantially normal to the water level. The water is standard rinse water and included a resistance of about 17 megohms, and had a temperature of about 70° F. In the immersed position, the wafer was substantially wet.

To dry the wafer, water was drained from the bottom of vessel. The water level was substantially normal to the wafer faces. The water was drained at a substantially constant rate from the bottom of the vessel. During the draining step, the wafer remained substantially motionless.

By way of an adjustable outlet valve at the drain, a different drain speed in multiple runs was used to determine the particular drain rates at which drying occurred more effectively. Drain speed is measured by the amount of time necessary to drain the water from the vessel in terms of decreasing water level measured in millimeters per second (mm/sec.).

Figure 10:
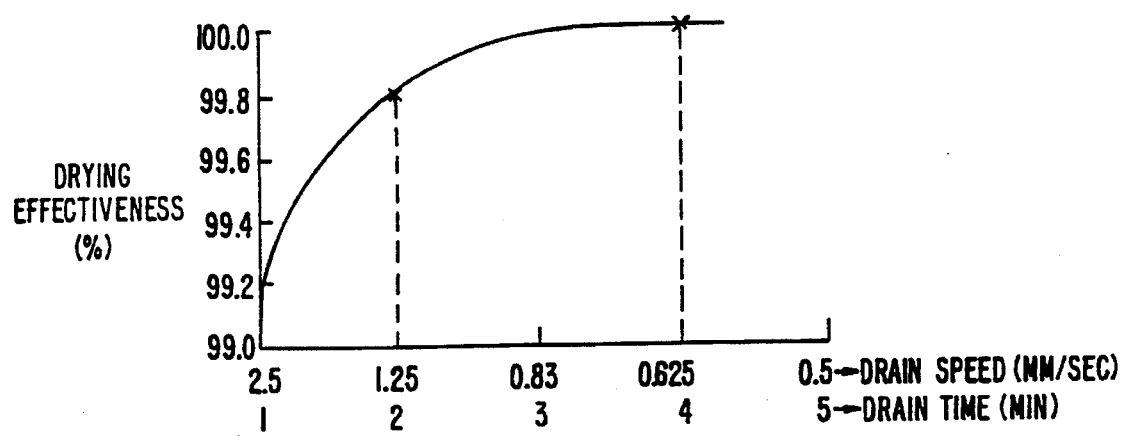
FIG. 10 illustrates drying effectiveness as a function of drain speed for an experiment performed according to the present invention.

FIG. 10 illustrates a "drying effectiveness" as a function of drain speed (in millimeters per second). The drying effectiveness is a surface area percentage of the wafer without water residue, measured as a percentage. The surface area of the wafer includes the faces and wafer edges. As noted above, it is quite important to remove all water from the wafer which often includes a meniscus at the wafer edges. As shown, the drying effectiveness in this experiment is a non-linear function with respect to drain speed. For example, the drying effectiveness of the sample wafer is about 99.0% at a drain speed of about 2.5 mm/sec. A drain speed of about 1.25 mm/sec. has a drying effectiveness of about 99.8%. A drying effectiveness of about 100% (or completely dry wafer excluding wafer edges) was produced with a drain speed of about 0.83 mm/sec. and less. Any residual water on the wafer edges was removed by hot dry nitrogen being introduced for about 2 minutes or less.

This experiment shows that a substantially dry wafer may be produced by way of an embodiment of the present process. This present process does not rely upon any potentially harmful organic solvents or the like. In addition, the present process provides a substantially dry wafer without mechanical movement of the wafer thereby decreasing the possibility of any mechanical damage of the wafer loss due to machine malfunction. Furthermore, the substantially wafer may be provided without the use of a heater or heating element, thereby decreasing hazards of fire and such. Accordingly, this experiment shows a safe, efficient, and easy method of drying a wafer according to the present invention.

While the above is a full description of the specific embodiments, various modifications, alternative constructions, and equivalents may be used. For example, while the description above is in terms of a method and apparatus for semiconductor wafers, it would be possible to implement the present invention to the manufacture of raw wafers, disks and heads, flat panel displays, microelectronic masks, and other applications requiring high purity wet processing such as steps of rinsing, drying, and the like. In addition, the systems of FIGS. 1–4 are in terms of a rinse/dry system for semiconductors. A skilled artisan may, alteratively, employ such systems to other industries such as electro-chemical, pharmaceutical, printed circuit board, optical devices, and any other industry that needs an improved technique to rinse and dry an article of manufacture.

Therefore, the above description and illustrations should not be taken as limiting the scope of the present invention which is defined by the appended claims.

What is claimed is:

1. A method for cleaning and drying a semiconductor wafer comprising:

introducing a partially completed semiconductor wafer into a chamber;

immersing said partially completed semiconductor wafer in a liquid comprising water, said partially completed semiconductor wafer including a front face, a back face, and an edge, said liquid being substantially free from particles greater than about 0.2 microns in diameter;

displacing said liquid with a gaseous mixture in said chamber, said liquid being displaced along said front face of said partially completed semiconductor wafer, said gaseous mixture comprising a carrier gas and a trace of polar organic compound, said trace of polar organic compound being a non-saturated vapor in said chamber, said trace of polar organic compound causing particles to be removed from said front face; and directing a drying fluid at said partially completed semiconductor wafer, said drying fluid removing any remaining amount of said liquid from said edge;

wherein said partially completed semiconductor wafer is substantially stationary during said displacing and directing, thereby decreasing a possibility of any damage to said partially completed semiconductor wafer due to movement of said partially completed semiconductor wafer.

2. The method of claim 1 wherein said carrier gas is selected from a group consisting of oxygen, nitrogen, argon, and mixtures thereof.

3. The method of claim 1 wherein said drying fluid is at a temperature ranging from about 75° C. to about 175° C.

4. The method of claim 1 wherein said partially completed semiconductor wafer has a portion which is substantially free from oxidation before said immersing.

5. The method of claim 1 wherein said partially completed wafer is a recently etched wafer.

6. The method of claim 1 wherein said displacing occurs at a rate of about 2.0 mm/sec. or less as measured along said front face.

7. The method of claim 1 wherein said displacing occurs at a rate between about 0.5 mm/sec. and 2.0 mm/sec. as measured along said front face.

8. The method of claim 1 wherein said displacing occurs at a rate not exceeding 4.0 mm/sec. as measured from said front face.

9. The method of claim 1 wherein said drying fluid comprises nitrogen gas.

10. A method for cleaning a semiconductor wafer comprising:

immersing a partially completed semiconductor wafer in a liquid comprising water; and displacing said liquid with a gas, said gas being substantially free from any polar organic compounds and therefore more environmentally safe, said liquid being displaced along a face of said partially completed semiconductor wafer;

wherein said displacing occurs at a rate not exceeding about 2.5 mm/sec. as measured from said face to remove particles from said partially completed semiconductor wafer; and wherein said partially completed semiconductor wafer is substantially stationary during said displacing to decrease a possibility of any damage to said partially completed semiconductor wafer due to movement of said partially completed semiconductor wafer.

11. The method of claim 10 wherein said liquid is substantially free from particles greater than about 0.1 microns in diameter.

12. The method of claim 6 or 10 wherein said rate is a substantially constant rate.

13. The method of claim 30 wherein said liquid is filtered through an ultraviolet purification unit.

14. The method of claim 10 wherein said gas is selected from a group consisting of air, oxygen, nitrogen, argon, and mixtures thereof.

15. The method of claim 10 wherein said gaseous mixture is at a temperature ranging from about 75° C. to about 175° C.

16. The method of claim 10 wherein said partially completed wafer is substantially free from oxidation before said immersing.

17. The method of claim 16 wherein said partially completed wafer recently etched wafer.

18. The method of claim 10 wherein said displacing occurs at a rate of about 2.0 mm/sec. or less.

19. The method of claim 10 wherein said displacing occurs at a rate between about 0.5 mm/sec. and 2.0 mm/sec.

20. The method of claim 10 further comprising a step of introducing a drying fluid to remove any amount of said liquid from said partially semiconductor completed wafer.

21. The method of claim 10 wherein said gas is at about 70 ° C.

22. A method of cleaning semiconductor wafers, said method comprising steps of:

immersing a wafer into a cleaning liquid, said wafer comprising particulate contamination thereon, said cleaning liquid being substantially free from particulate contamination having a diameter greater than about 0.2 micron;

dropping a liquid level of said cleaning liquid at a rate around said wafer to pull particulate contamination therefrom;

wherein said rate is no greater than 4.0 mm/sec. as measured along a front face of said wafer; and wherein said wafer is substantially stationary during said dropping step to decrease a possibility of any damage of said wafer due to movement of said wafer.

23. The method of claim 22 wherein cleaning liquid comprises water.

24. The method of claim 23 wherein said water is filtered through a plurality of charged filters.

25. The method of claim 24 wherein said plurality of charged filters includes a negatively charged filter and a positively charged filter.

26. The method of claim 23 wherein said cleaning liquid is replaced by a gaseous mixture.

27. The method of claim 1 or 26 wherein said gaseous mixture is at about 70° F.

28. The method of claim 26 wherein said gaseous mixture is substantially a carrier gas with a trace of a polar organic compound, said trace of polar organic compound being a non-saturated vapor in a chamber enclosing said wafer.

29. The method of claim 28 wherein said trace of said polar organic compound causes particulate contamination to be removed from said wafer.

30. The method of claims 1 or 28 wherein said trace of polar organic compound is less than a milliliter.

31. The method of claim 22 wherein said rate is no greater than about 2.5 mm/sec. as measured from a front face of said wafer.

32. The method of claim 22 further comprising a step of introducing a drying fluid to remove any amount of said cleaning liquid from said wafer.

33. A method for cleaning a semiconductor wafer comprising:

introducing a partially completed wafer into a chamber, said partially completed wafer including a front face;

immersing said partially completed wafer in a liquid comprising water said liquid being substantially free from particles greater than about 0.2 microns in diameter and;

introducing a gaseous mixture into said chamber to replace said liquid, said liquid being displaced along said front face, said gaseous mixture comprising a carrier gas and a trace of polar organic compound, said trace of polar organic compound being a non-saturated vapor in said chamber, said trace of polar organic compound causing particles to be removed from said front face;

wherein said partially completed wafer is substantially stationary during said introducing of said gaseous mixture, thereby decreasing a possibility of any damage to said partially completed wafer due to movement of said partially completed wafer.

34. The method of claim 33 wherein said carrier gas is selected from a group consisting of oxygen, nitrogen, argon, and combinations thereof.

35. The method of claim 33 wherein said gaseous mixture is at a temperature ranging from about 75° F. to about 175° F.

36. The method of claim 33 wherein said partially completed wafer is supported in a carrier having an acute angle less than about 15 degrees from a vertical position to prevent said partially completed wafer from sticking to an adjacent partially completed wafer in said carrier.

37. The method of claim 33 wherein said partially completed wafer is substantially free from oxidation before said immersing.

38. The method of claim 33 wherein said partially completed wafer is a recently etched wafer.

39. The method of claim 33 wherein said introducing occurs at a rate of about 2.0 mm/sec. or less as measured along said front face.

40. The method of claim 22 or 39 wherein said rate is a substantially constant rate.

41. The method of claim 33 wherein said introducing occurs at a rate between about 0.5 mm/sec. and 2.0 mm/sec. as measured along said front face.

42. The method of claim 33 wherein said gaseous mixture is at about 70° F.

43. The method of claims 33 wherein said trace of polar organic compound is less than a milliliter.

44. The method of claim 33 further comprising a step of introducing a drying fluid into said chamber to remove a possible amount of said liquid from said partially completed wafer.

* * * * *